United States Patent
Clampitt et al.

(10) Patent No.: US 6,352,932 B1
(45) Date of Patent: *Mar. 5, 2002

(54) METHODS OF FORMING INTEGRATED CIRCUITRY AND INTEGRATED CIRCUITRY STRUCTURES

(75) Inventors: Darwin A. Clampitt, Boise; James E. Green, Caldwell, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/550,401

(22) Filed: Apr. 14, 2000

Related U.S. Application Data

(63) Continuation of application No. 09/018,208, filed on Jan. 29, 1998, now Pat. No. 6,087,263.

(51) Int. Cl.$^7$ .............................. H01L 21/311
(52) U.S. Cl. .................. 438/700; 438/696; 438/753; 438/702
(58) Field of Search ................ 438/700, 702, 438/696, 736, 753, 618, 947, 738, 735, 719

(56) References Cited

U.S. PATENT DOCUMENTS

| | | |
|---|---|---|
| 3,144,366 A | 8/1964 | Rideout et al. |
| 3,579,057 A | 5/1971 | Stoller |
| 3,772,100 A | 11/1973 | Masuda et al. |
| 3,784,847 A | 1/1974 | Kurz et al. |
| 3,800,412 A | 4/1974 | Wall et al. |
| 4,648,937 A | 3/1987 | Ogura et al. |
| 4,894,697 A | 1/1990 | Chin et al. |
| 4,988,639 A | 1/1991 | Aomura |
| 5,013,680 A | 5/1991 | Lowrey et al. |
| 5,047,117 A | 9/1991 | Roberts |
| 5,100,508 A | 3/1992 | Yoshida et al. |
| 5,628,917 A | 5/1997 | MacDonald et al. |
| 5,660,680 A | 8/1997 | Keller |
| 5,828,094 A | 10/1998 | Lee |
| 5,910,339 A | 6/1999 | Blakely et al. |
| 5,966,600 A | 10/1999 | Hong |
| 6,303,272 B1 * | 10/2001 | Furukawa et al. |

FOREIGN PATENT DOCUMENTS

| | | | | |
|---|---|---|---|---|
| EP | 0701285 A3 * | 7/1996 | ............ | H01L/21/82 |
| EP | 0967654 A1 * | 12/1999 | ....... | H01L/21/8247 |

* cited by examiner

Primary Examiner—Matthew Smith
Assistant Examiner—Renzo N. Rocchegiani
(74) Attorney, Agent, or Firm—Wells, St. John, Roberts, Gregory & Matkin

(57) ABSTRACT

In one aspect, a plurality of layers are formed over a substrate and a series of first trenches are etched into a first of the layers in a first direction. A series of second trenches are etched into the first layer in a second direction which is different from the first direction. Collectively, the first and second trenches define a plurality of different substrate elevations with adjacent elevations being joined by sidewalls which extend therebetween. Sidewall spacers are formed over the sidewalls, and material of the first layer is substantially selectively etched relative to material from which the spacers are formed. Material comprising the spacer material is substantially selectively etched relative to the first material. In a preferred implementation, the etching provides a plurality of cells which are separated from one another by no more than a lateral width dimension of a previously-formed spacer.

65 Claims, 19 Drawing Sheets

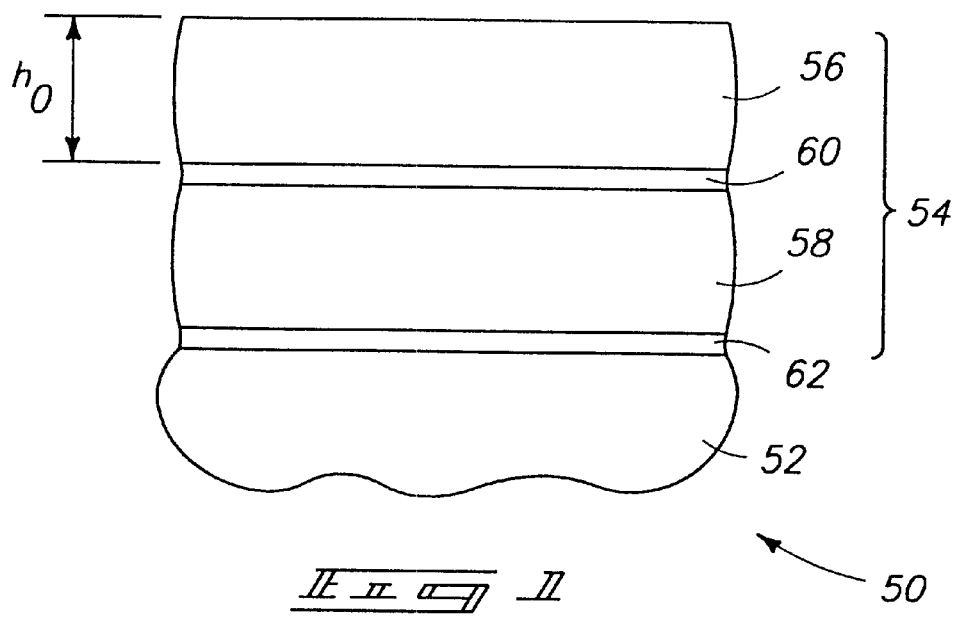
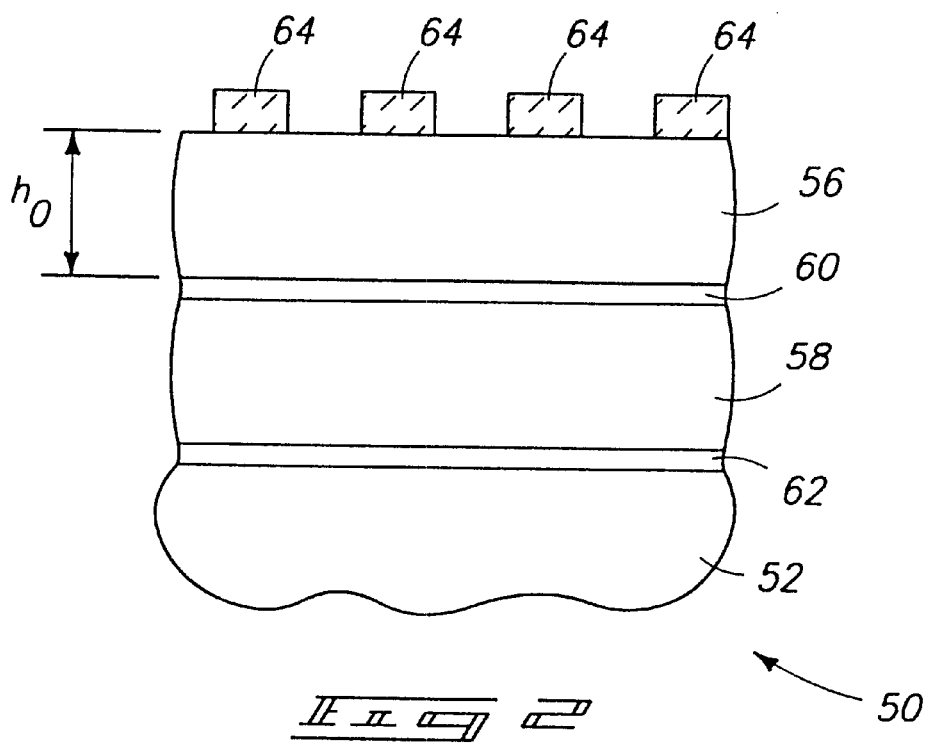

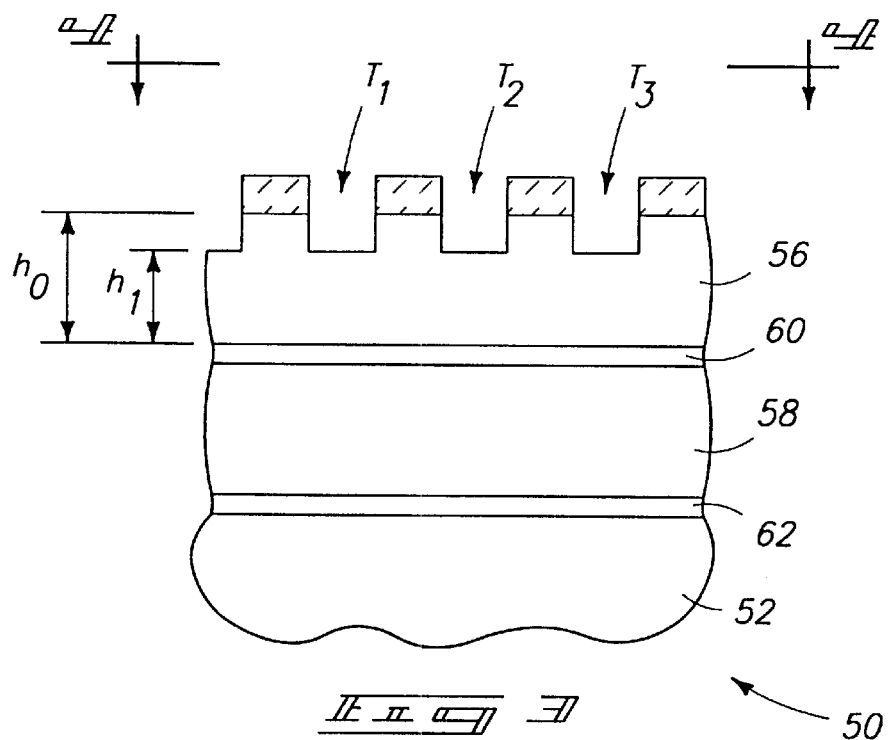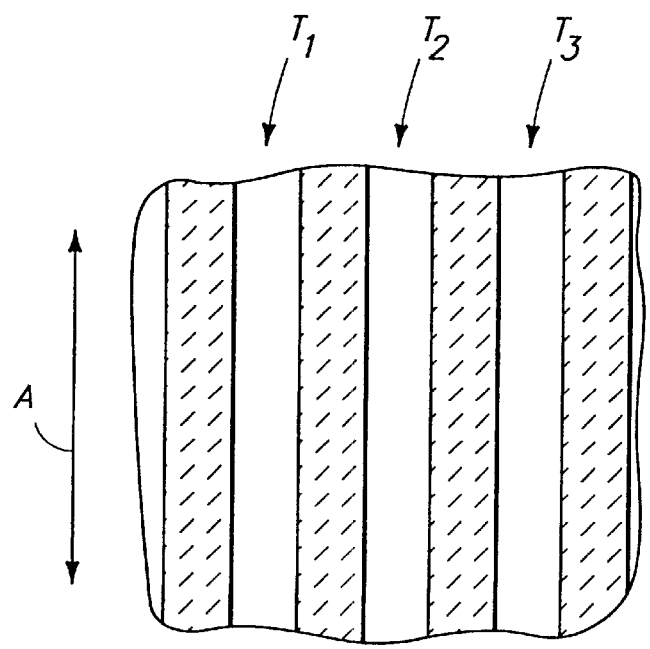

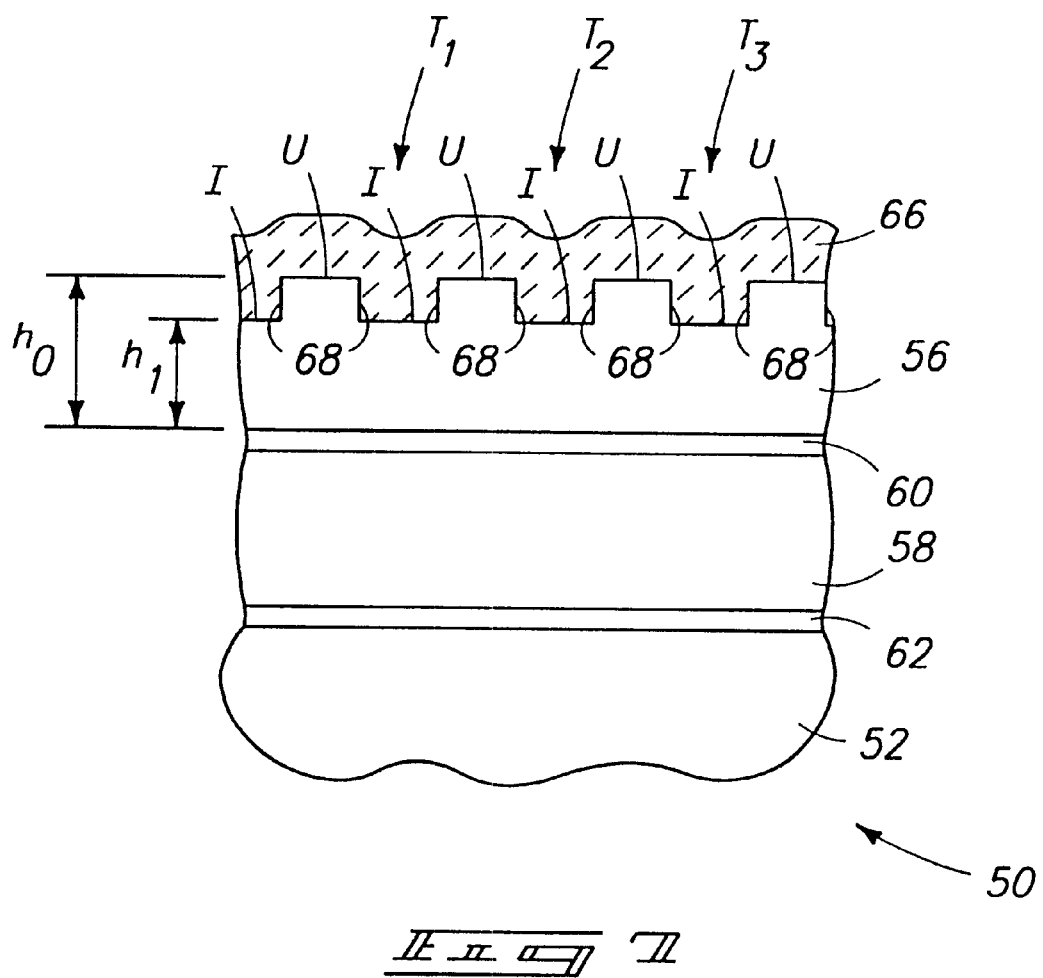

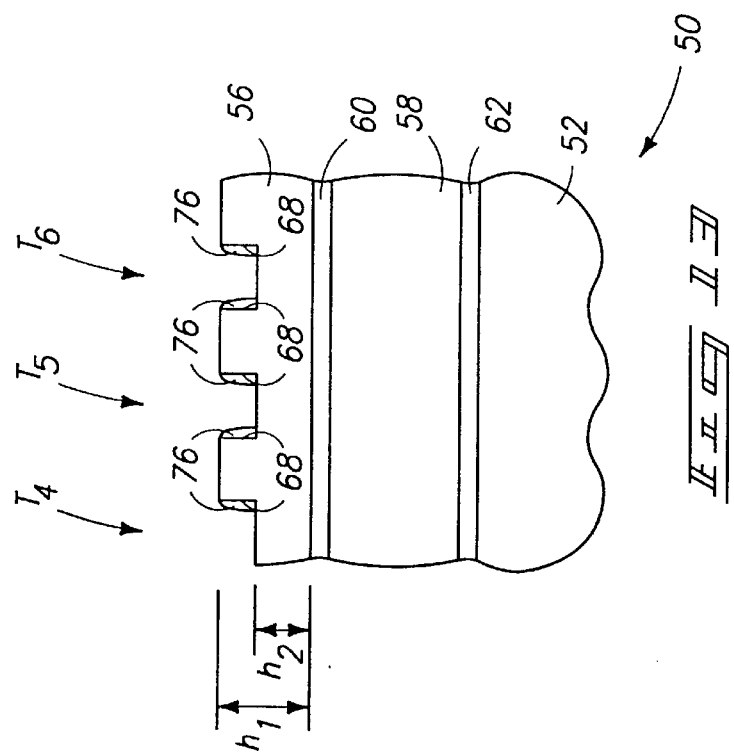
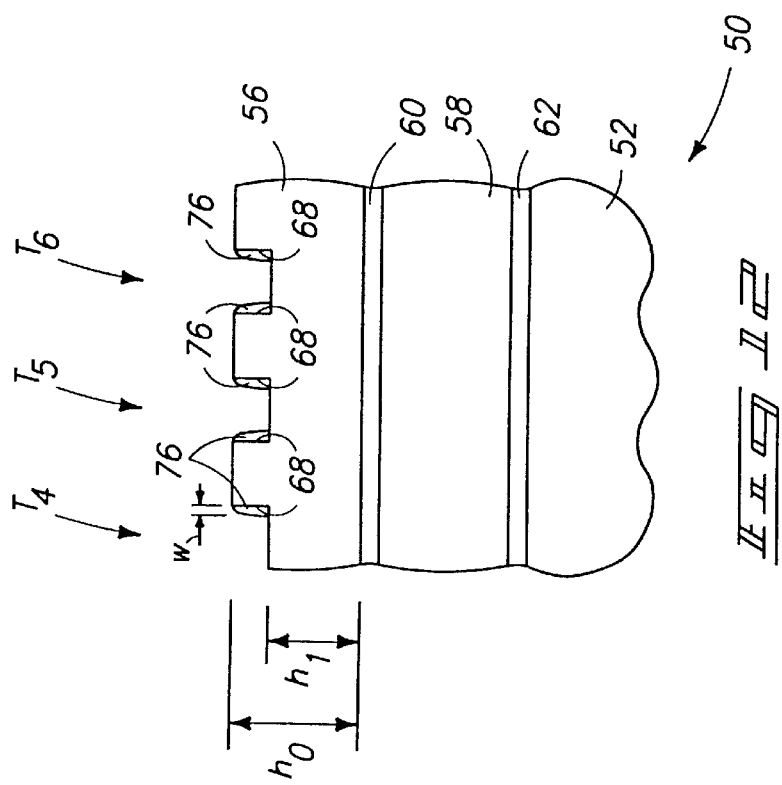

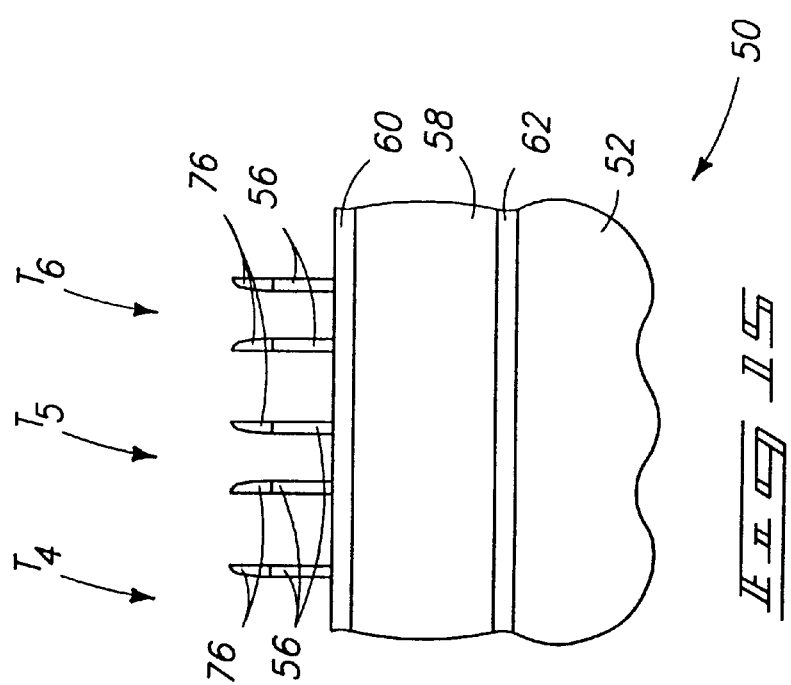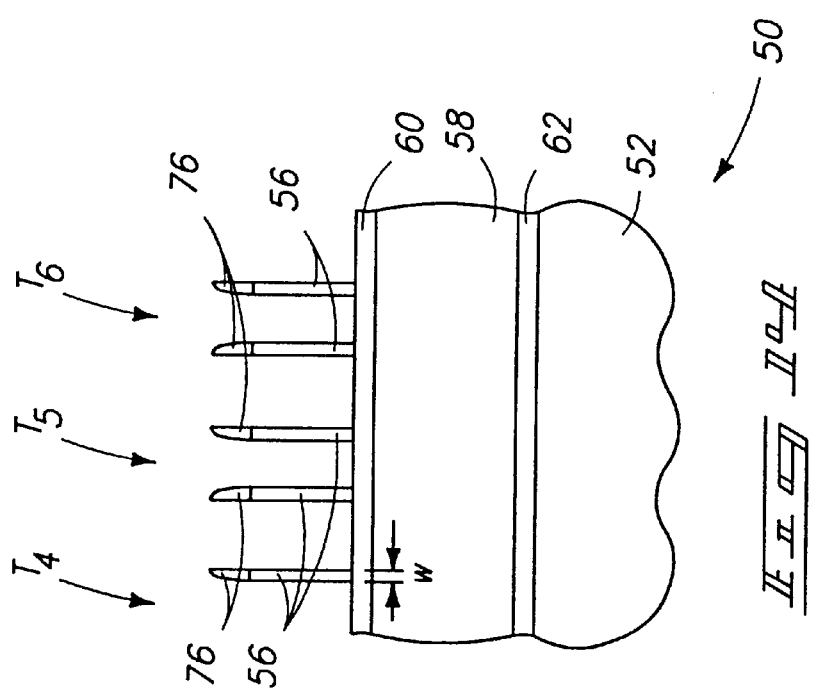

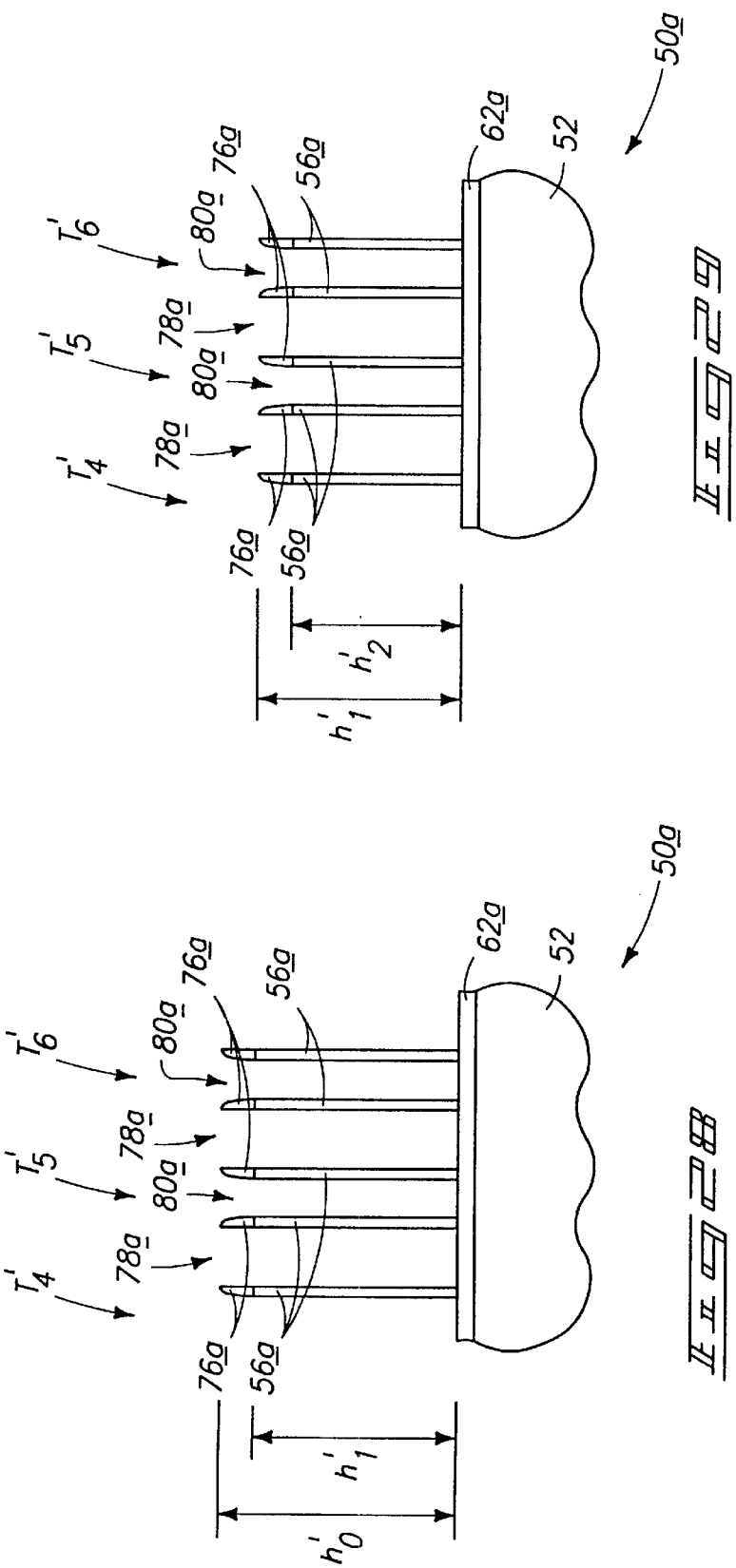

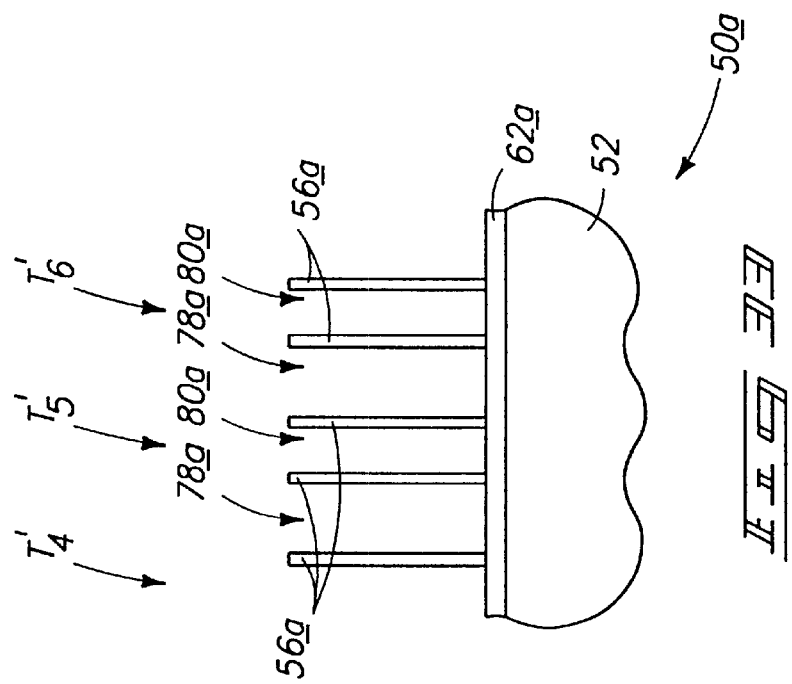
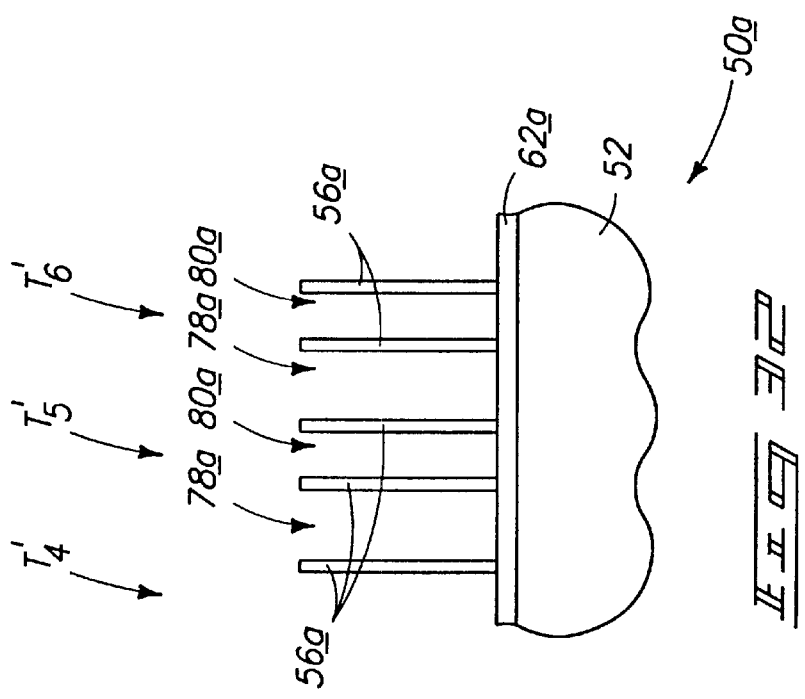

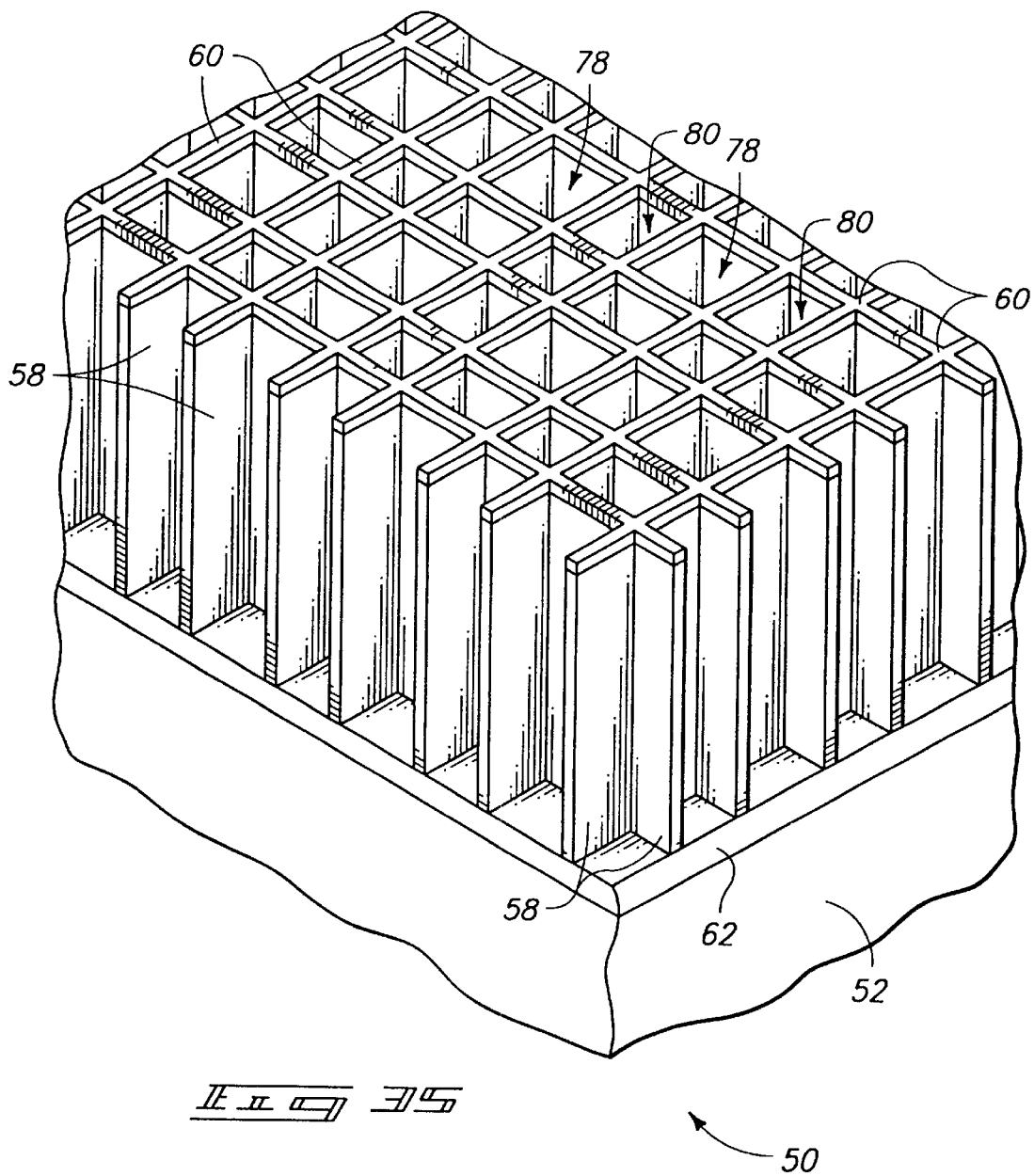
$\mathbb{F}\mathbb{I}\mathbb{G}\ 35$

US 6,352,932 B1

METHODS OF FORMING INTEGRATED CIRCUITRY AND INTEGRATED CIRCUITRY STRUCTURES

CROSS REFERENCE TO RELATED APPLICATION

This is a Continuation of U.S. patent application Ser. No. 09/018,208, filed Jan. 29, 1998, now U.S. Pat. No. 6,087,263 and titled "Methods of Forming Integrated Circuitry and Integrated Circuitry Structures."

TECHNICAL FIELD

This invention pertains to methods of forming integrated circuitry and to resultant integrated circuitry structures.

BACKGROUND OF THE INVENTION

Integrated circuitry devices which are fabricated on or over semiconductor wafers typically undergo one or more photolithographic steps during formation. During such photolithographic steps, device features can be etched using conventional techniques. The spacing between such devices is important because often times adjacent devices must be electrically isolated from one another to avoid undesirable shorting conditions.

One of the limitations on device spacing stems from limitations inherent in the photolithographic process itself. In the prior art, devices are generally spaced only as close as the minimum photolithographic limit will permit.

This invention arose out of concerns associated with integrated circuitry structures having spacing aspects which are not necessarily limited by minimum photolithographic feature sizes.

SUMMARY OF THE INVENTION

In one aspect, a plurality of layers are formed over a substrate and a series of first trenches are etched into a first of the layers in a first direction. A series of second trenches are etched into the first layer in a second direction which is different from the first direction. Collectively, the first and second trenches define a plurality of different substrate elevations, with adjacent elevations being joined by sidewalls which extend therebetween. Sidewall spacers are formed over the sidewalls, and material of the first layer is substantially selectively etched relative to material from which the spacers are formed. Material comprising the spacer material is substantially selectively etched relative to the first material. In a preferred implementation, the etching provides a plurality of cells which are separated from one another by no more than a lateral width dimension of a previously-formed spacer.

BRIEF DESCRIPTION OF THE DRAWINGS

Preferred embodiments of the invention are described below with reference to the following accompanying drawings.

FIG. 1 is a diagrammatic sectional view of a semiconductor wafer fragment in process in accordance with one aspect of the invention.

FIG. 2 is a view of the FIG. 1 wafer fragment at a different processing step.

FIG. 3 is a view of the FIG. 1 wafer fragment at a different processing step.

FIG. 4 is a view taken along line 4—4 in FIG. 3.

FIG. 7 is a view of the FIG. 5 wafer fragment taken along line 7—7 in FIG. 5.

FIGS. 12 and 13 are respective views of the FIGS. 8 and 9 wafer fragment at another processing step.

FIGS. 14 and 15 are respective views of the FIGS. 8 and 9 wafer fragment at another processing step.

FIGS. 24 and 25 are views respectively taken along lines 24—24 and 25—25 in FIG. 23.

FIGS. 28 and 29 are respective views of the FIGS. 24 and 25 wafer fragment at another processing step.

FIGS. 30 and 31 are respective views of the FIGS. 24 and 25 wafer fragment at another processing step.

FIGS. 32 and 33 are respective views of the FIGS. 24 and 25 wafer fragment at another processing step.

FIG. 34 is an enlarged perspective view of the FIGS. 12 and 13 wafer fragment showing a plurality of different elevational levels. A portion of the figure has been broken away for clarity.

FIG. 35 is a perspective view of the FIGS. 18 and 19 wafer fragment.

DETAILED DESCRIPTION OF THE PREFERRED EMBODIMENTS

Figure 5:
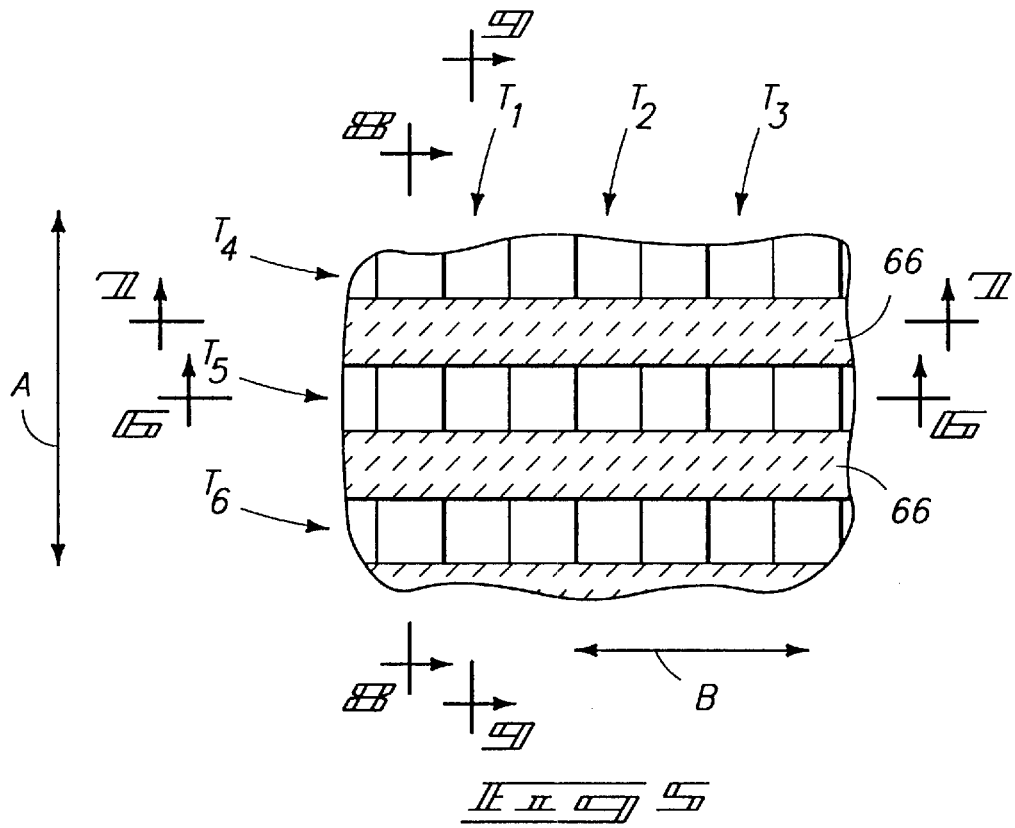
FIG. 5 is a view of the FIG. 4 wafer fragment at another processing step.
Figure 6:
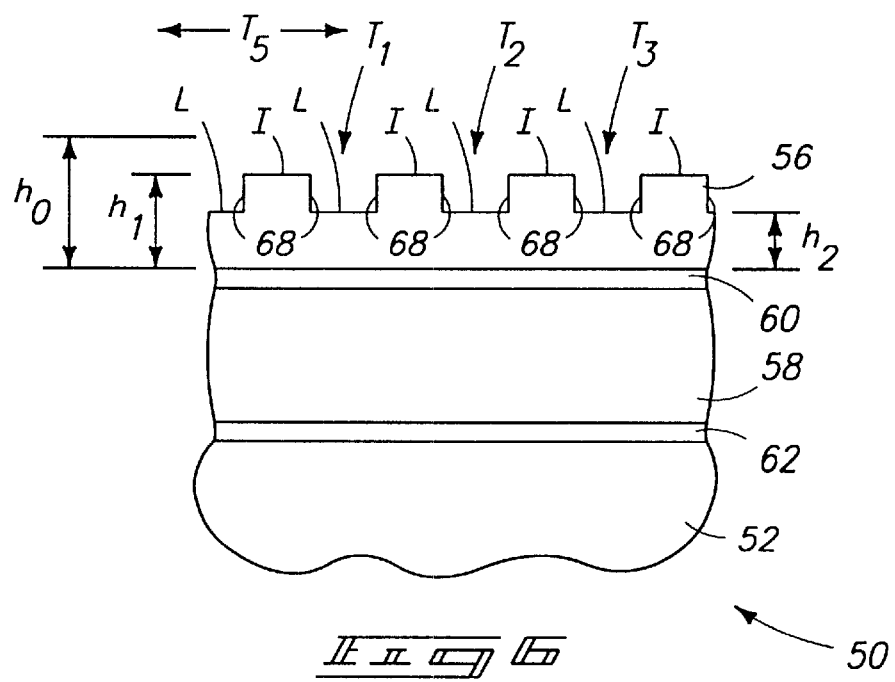
FIG. 6 is a view of the FIG. 5 wafer fragment taken along line 6—6 in FIG. 5.
Figure 9:
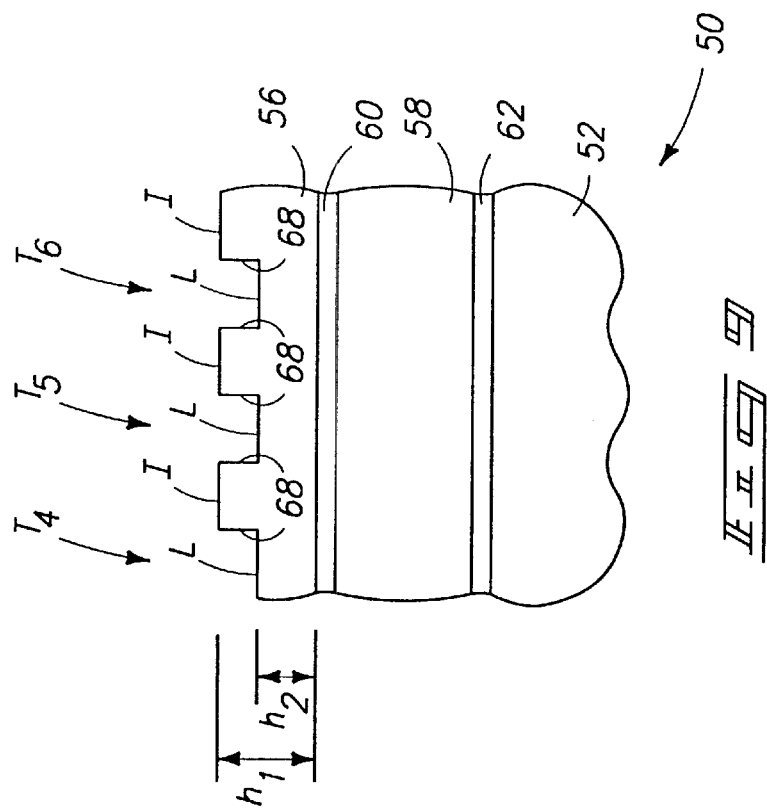
FIGS. 8 and 9 are views of the FIG. 5 wafer fragment taken respectively along lines 8—8 and 9—9 in FIG. 5.
Figure 8:
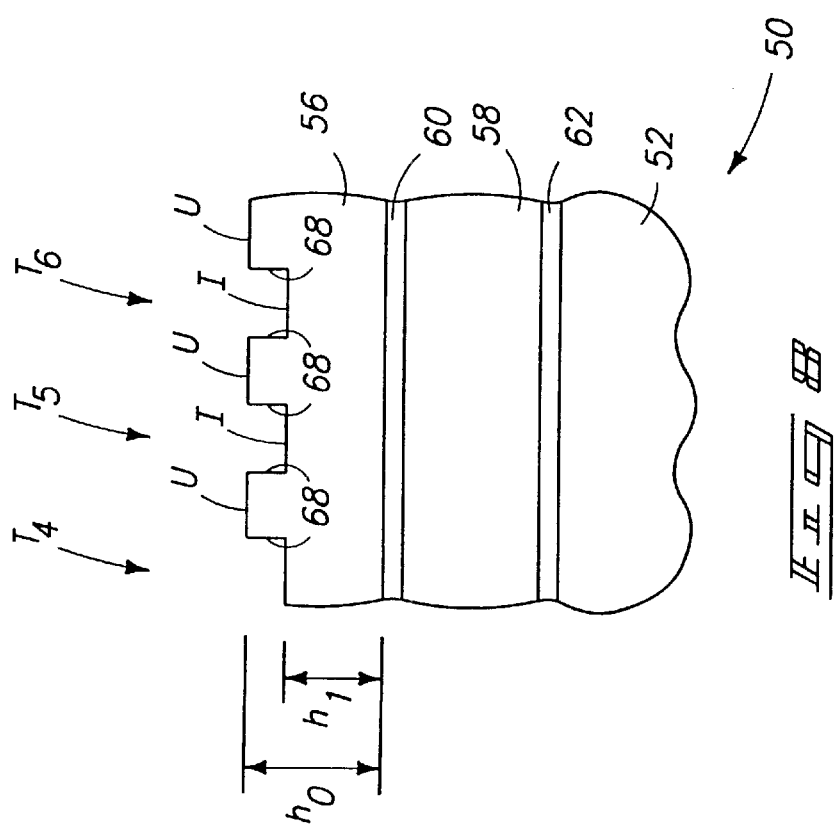
Figure 10:
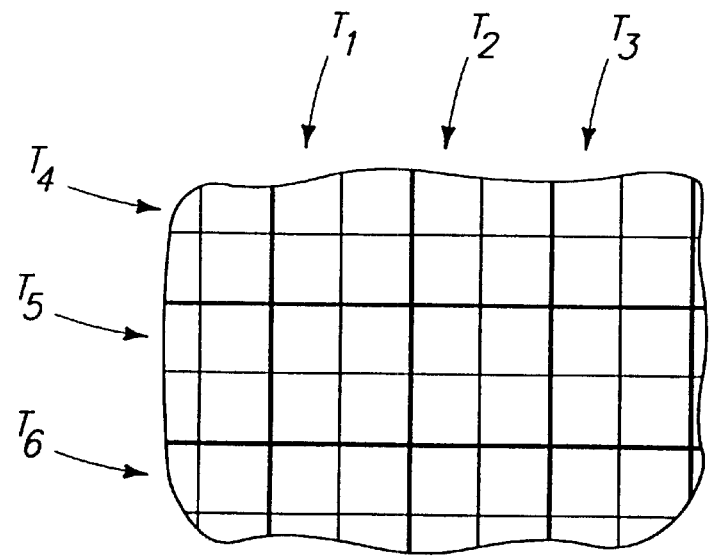
FIG. 10 is a view of the FIG. 5 wafer fragment at another processing step.

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment in process is indicated generally by reference numeral 50 and comprises a semiconductive substrate 52. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. A plurality of layers are formed over substrate 52 and define an assembly of layers 54. In the illustrated example, assembly 54 comprises a first layer 56 and a second layer 58 interposed between first layer 56 and substrate 52. An optional third layer 60 can be provided and is interposed between first layer 56 and second layer 58. Third layer 60 serves as an etch stop layer as will become apparent below. An optional fourth layer 62 can be provided elevationally below second layer 58.

Layer 56 defines an elevational height $h_0$ which is taken relative to layer 60. A desirable aspect of the layers comprising assembly 54 are that the individual layers exhibit a very good etch selectivity, e.g. about 50:1 or more, relative to an underlying layer disposed immediately therebeneath. Accordingly and in the illustrated example, first and second layers 56, 58 preferably comprise etchably similar materials while intervening layer 60 comprises a material which is etchably different from either of layers 56, 58. An exemplary material for layers 56, 58 comprises an oxide material such as borophosphosilicate glass. An exemplary material for layer 60 comprises polysilicon. An exemplary material for layer 62 comprises silicon nitride. Of course, either material could be used for layers 60 and 62 depending on the structure being made.

Referring to FIG. 2, a layer of patterned photoresist 64 is formed over substrate 52 and atop layer 56.

Referring to FIGS. 3 and 4, a first series of first trenches $T_1, T_2, T_3$ are etched or otherwise formed into first layer 56 and in a first direction A (FIG. 4). Trenches $T_1, T_2, T_3$ include bottommost portions which define an elevational height $h_1$ which is less than $h_0$. An exemplary depth for the trench-forming etch is between about 1,000 to 2,000 Angstroms. Photoresist 64 is subsequently removed.

Referring to FIGS. 5–9, a layer of patterned photoresist 66 (FIG. 5) is formed over substrate 52 and defines a second series of second trenches $T_4, T_5, T_6$ which are subsequently etched into first layer 56 in a second direction B. In the illustrated example, second direction B is different from first direction A, and generally transverse relative thereto. Some of the substrate area which is exposed between photoresist 66 is etched to define an elevational height $h_2$ (FIGS. 6 and 9) which is less than either of heights $h_1$ and $h_0$. Those portions of the substrate which define elevational heights $h_2$ have been correspondingly etched twice. Those portions of the substrate which define elevational heights $h_1$ have been correspondingly etched only once. Similarly, those portions of the substrate which define elevational heights ho have not been etched at all. An exemplary depth for the second trench-forming etch is between about 1,000 to 2,000 Angstroms.

Referring to FIGS. 6–11, and 34, the net effect of the abovedescribed first and second etchings is that an array of trenches, e.g. $T_1, T_2, T_3, T_4, T_5$, and $T_6$, are formed in first layer 56. The trench array defines a plurality of different substrate elevations or elevational heights. In the illustrated example, first, second, and third elevations are defined. Exemplary first, second, and third elevations are respectively indicated at 70, 72, and 74 and have been separately designated with letters to assist the reader. First elevation 70 defines a lowermost elevation L (which corresponds to elevational height $h_2$). Second elevation 72 defines an intermediate elevation I (which corresponds to elevational height $h_1$). Third elevation 74 defines an uppermost elevation U (which corresponds to elevational height $h_0$). First, second, and third elevations 70, 72, and 74 define a matrix of elevational planes within assembly 54 (FIGS. 6–9). Adjacent elevations are joined by sidewalls 68 (FIGS. 6–9) which extend therebetween.

In the illustrated example, at least some of the lowermost elevations L are disposed proximate four intermediate elevations I. At least some of the intermediate elevations I are disposed proximate two lowermost elevations L and two uppermost elevations U. At least some of the uppermost elevations U are disposed proximate four intermediate elevations I. Additionally, individual trenches comprise no more than two elevations therewithin. For example, trench $T_1$ comprises only intermediate I and lowermost L elevations.

Figure 11:
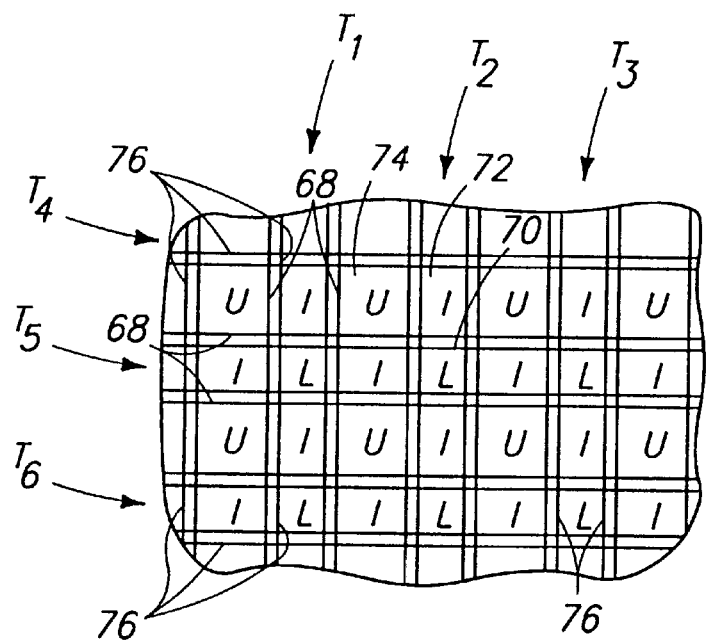
FIG. 11 is a view of the FIG. 10 wafer fragment at another processing step.

Referring to FIGS. 11–13, sidewall spacers 76 are formed over sidewalls 68 which extend between adjacent elevations. Preferably, spacers 76 are formed from a material which is etchably different from first layer 56. Accordingly, where first layer 56 comprises an oxide, a suitable material for sidewall spacers 76 comprises polysilicon. In another aspect, the material from which spacers 76 are formed comprises a material which is etchably similar to the material from which layer 60 is formed. Preferably, such materials are the same material and an exemplary material is polysilicon. As sidewalls 68 are formed at different relative elevations over the substrate, sidewall spacers 76 are formed at different elevations as well. Collectively, sidewall spacers 76 provide an array of sidewall spacers which define individual substrate structure profiles which are to be transferred into at least one of the layers underlying the spacers. Individual substrate is structure profiles, e.g., sidewall spacers 76, comprise respective lateral width dimensions w (FIG. 12) which are less than respective height dimensions of the spacers.

Referring to FIGS. 14 and 15, material of first layer 56 is substantially selectively etched relative to the material from which spacers 76 are formed. Such etch is preferably anisotropic and accordingly transfers lateral width dimension w of spacers 76 into layer 56. Where layer 60 comprises a material which is etchably different from layer 56, the etching of layer 56 can be controlled to slow down or terminate proximate layer 60.

Figure 17:
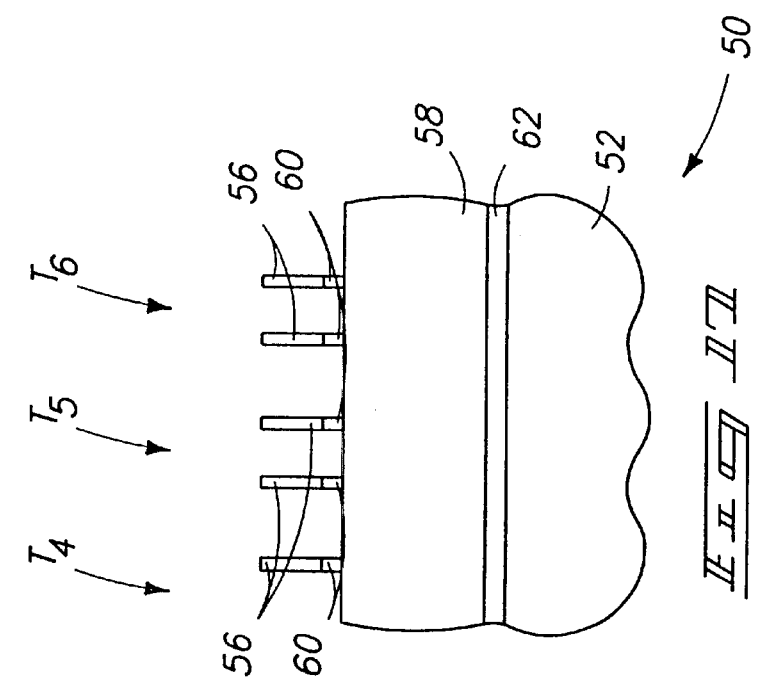
FIGS. 16 and 17 are respective views of the FIGS. 8 and 9 wafer fragment at another processing step.
Figure 16:
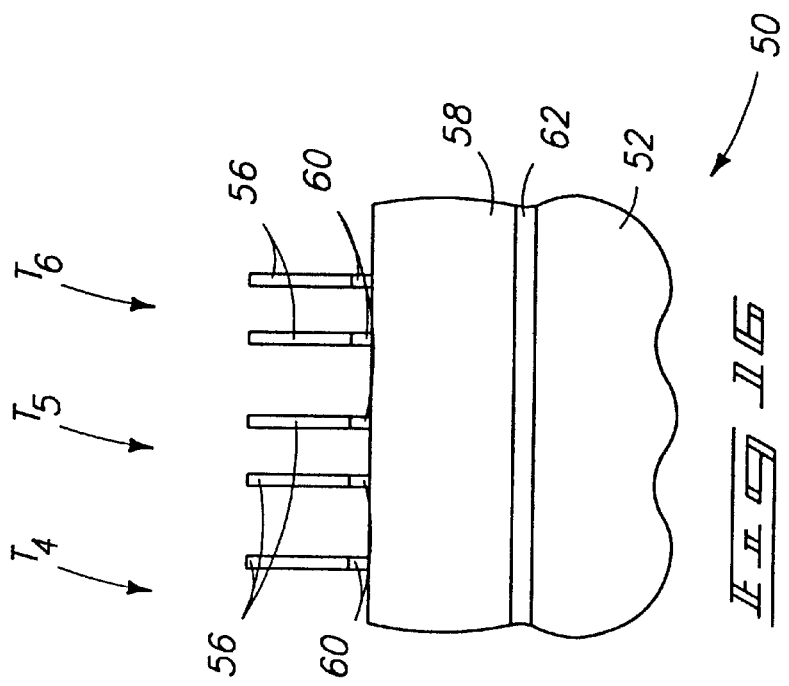

Referring to FIGS. 16 and 17, material comprising layer 60 is substantially selectively etched relative to material comprising layer 56. Where layer 60 and spacers 76 comprise etchably similar materials, such etching comprises etching the spacer material relative to the material of layer 56. Accordingly, the substrate structure profile is transferred into at least one different other underlying layer, e.g., layer 60.

Figure 19:
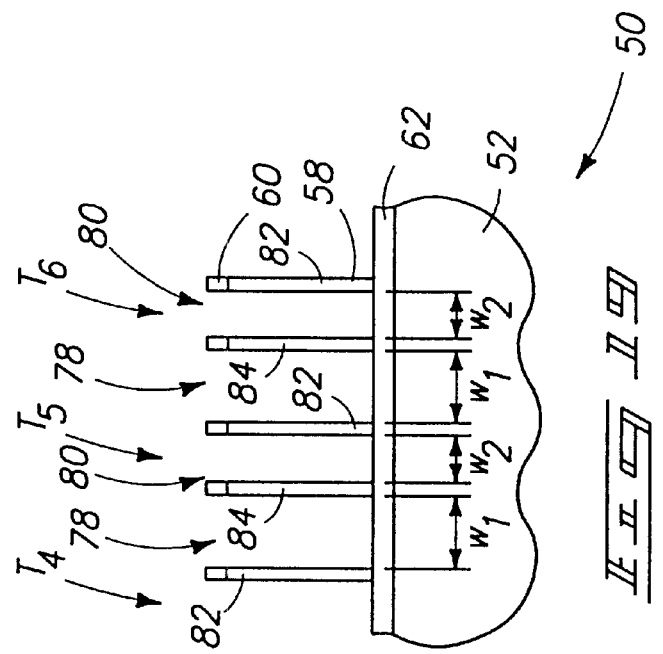
FIGS. 18 and 19 are respective views of the FIGS. 8 and 9 wafer fragment at another processing step.
Figure 18:
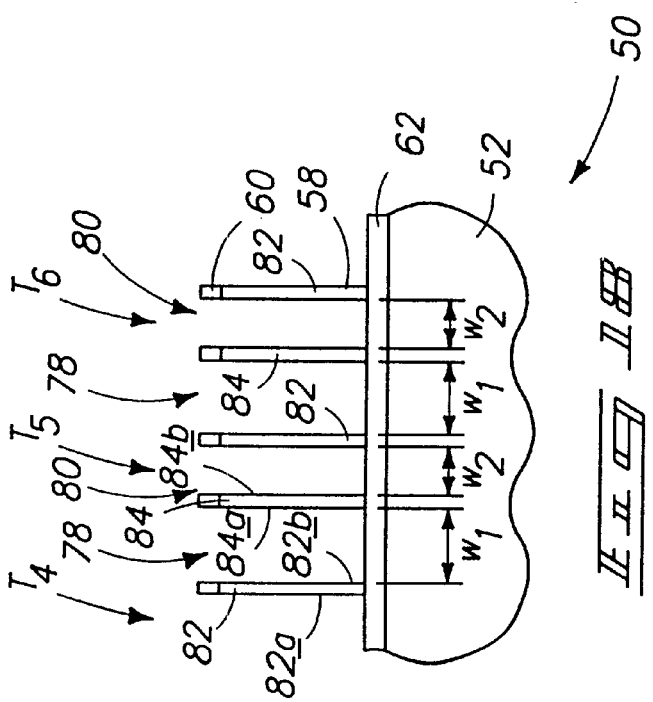

Referring to FIGS. 18, 19 and 35, material comprising layer 58 is substantially selectively etched relative to material comprising layer 60. Where layers 56 and 58 comprise etchably similar materials, such etching removes formerly remnant layer 56 portions (FIGS. 16, 17) overlying material 60. In the illustrated example, and where layers 56, 58 comprise etchably similar materials, the etching of layers 56, 58 comprises substantially selectively etching at least two of the layers relative to material from which sidewall spacers 76 (FIGS. 14, 15) are formed. Accordingly, the substrate structure profile is transferred into three of the layers comprising assembly 54, i.e., layers 56, 60, and 58.

The etching of the above-described layers can be conducted in one processing chamber, with pertinent etch chemistries being manipulated at appropriate processing points to achieve a desired degree of selectivity. The etching forms a plurality of cells 78, 80 which are separated from one another by no more than a width dimension of an individual spacer which was previously transferred thereinto. Individual cells are defined by a plurality of walls with two such exemplary walls being indicated at 82, 84. Such walls comprise material from layers 58, 60 which is left after the last-described etch. At least some of the individual walls are shared between adjacent cells. For example, in FIG. 18, the leftmost wall 84 is shared between cells 78, 80. Each wall comprises respective wall surfaces which face generally away from one another and into a respective one of the shared cells. For example, with respect to the leftmost wall 82, such comprises wall surfaces 82a, 82b which face generally away from one another. Adjacent wall 84 comprises wall surfaces 84a and 84b. Wall surfaces 82b and 84a face one another and define therebetween a first cell width dimension $w_1$ along a line which is generally transverse to the two surfaces. Adjacent cell 80 defines a second cell width dimension $w_2$. The illustrated cell width dimensions are different from one another and generally alternate between first and second width dimensions. More desirably, however, the originally formed photoresist patterns which define the trenches within which the sidewall spacers are formed can be spaced such that the resultant widths $w_1$, $w_2$ are substantially equivalent. For example, defining a space between individual lines of photoresist which is equal to the width of a photoresist line plus twice the width of a spacer (assuming the spacers are generally of equal width), would result in a plurality of cells which are generally equivalent in dimension. Additionally, it will be noted that the respective cells are individually generally uniform in height.

Referring to FIGS. 20–33 a wafer fragment in process in accordance with another implementation of the invention is set forth generally at 50a. Like numbers from the above-described embodiment are utilized where appropriate, with differences being indicated with the suffix "a" or with different numerals.

Figure 20:
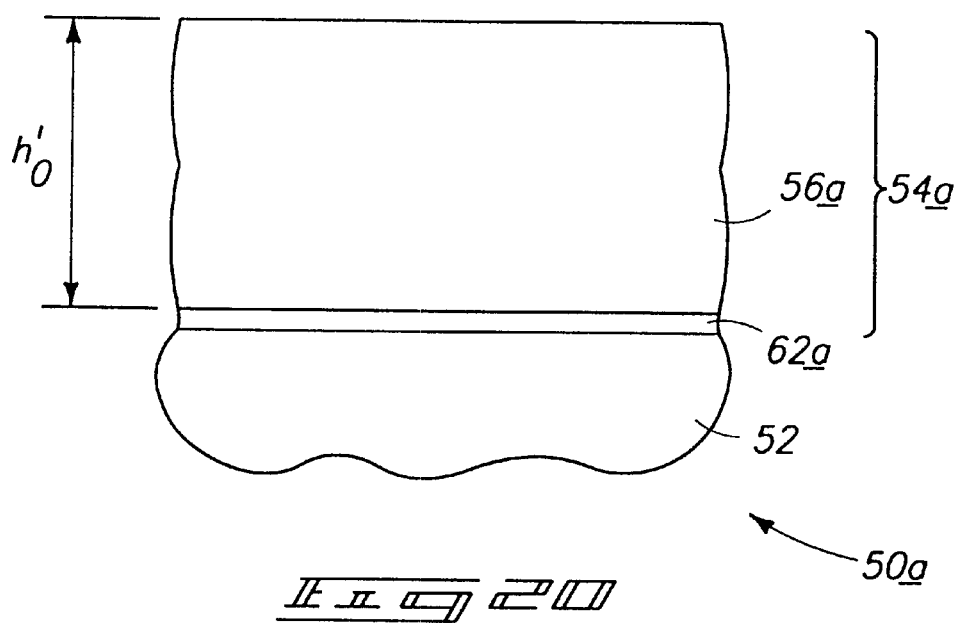
FIG. 20 is a diagrammatic view of a semiconductor wafer fragment in process in accordance with another aspect of the invention.

Referring to FIG. 20, an assembly 54a comprises a first layer 56a and a layer 62a elevationally below layer 56a. Layer 62a is an optional etch stop layer. Accordingly and in the illustrated example, layers 56a and 62a comprise etchably different materials. An exemplary material for layer 56a is an oxide such as one formed through decomposition of tetraethylorthosilicate (TEOS), borophosphosilicate glass (BPSG), phosphosilicate glass (PSG), and the like. An exemplary material for layer 62a is nitride.

Figure 21:
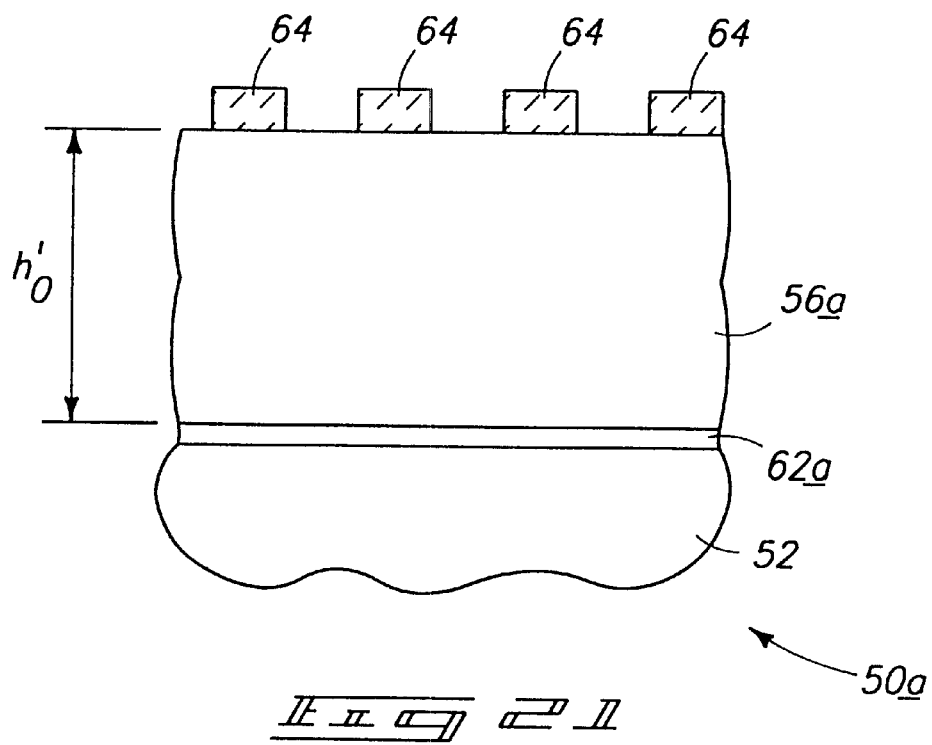
FIG. 21 is a view of the FIG. 20 wafer fragment at another processing step.
Figure 22:
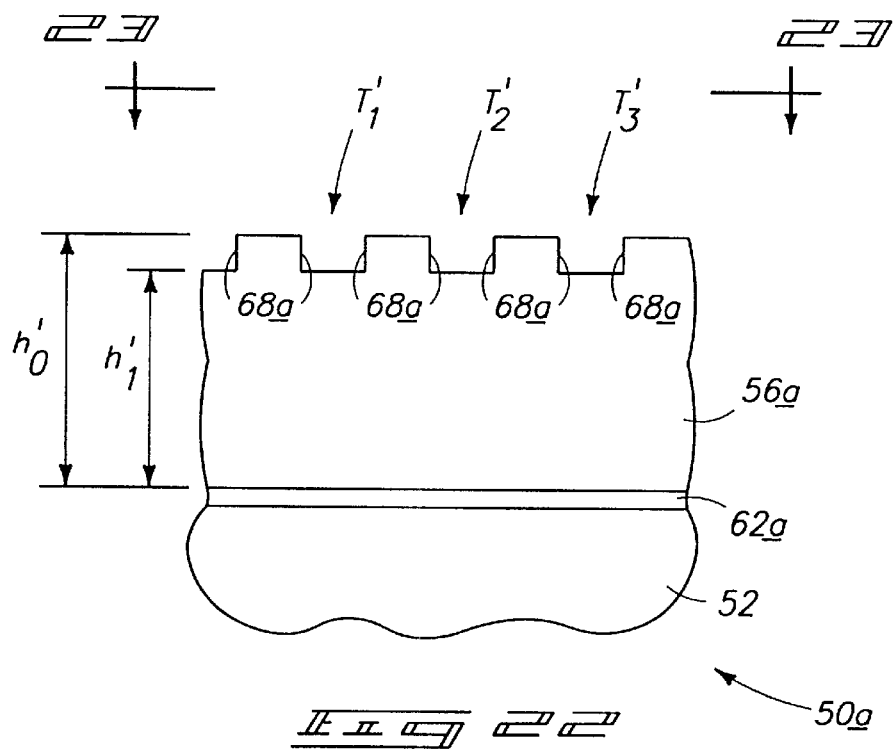
FIG. 22 is a view of the FIG. 20 wafer fragment at another processing step.
Figure 23:
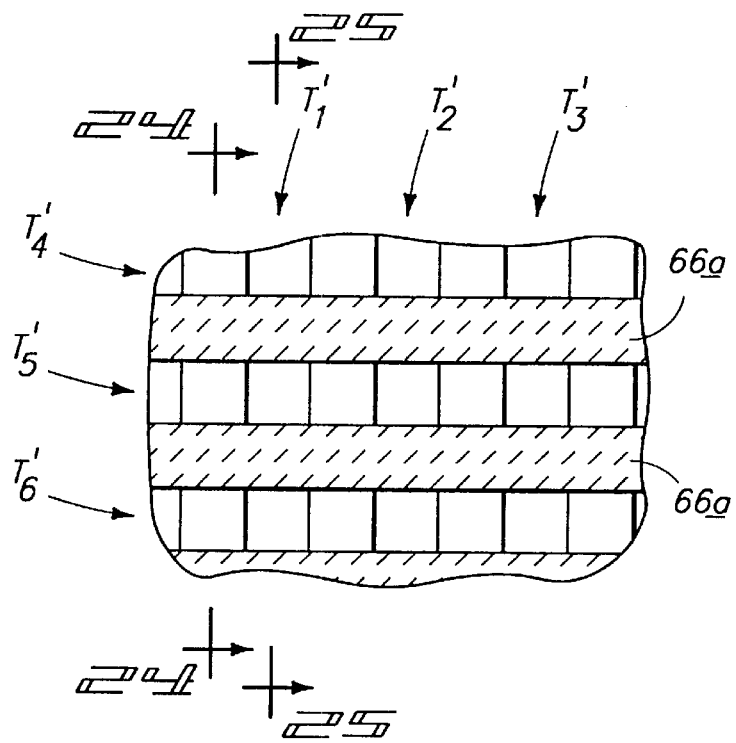
FIG. 23 is a view taken along line 23—23 in FIG. 22 at another processing step.
Figure 6H:
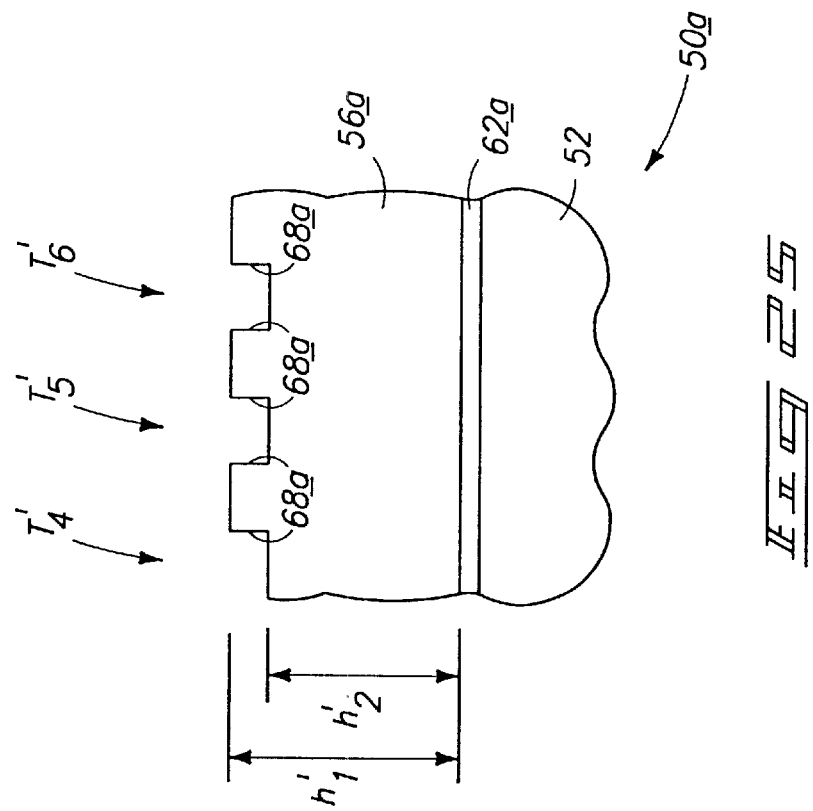
Figure 6I:
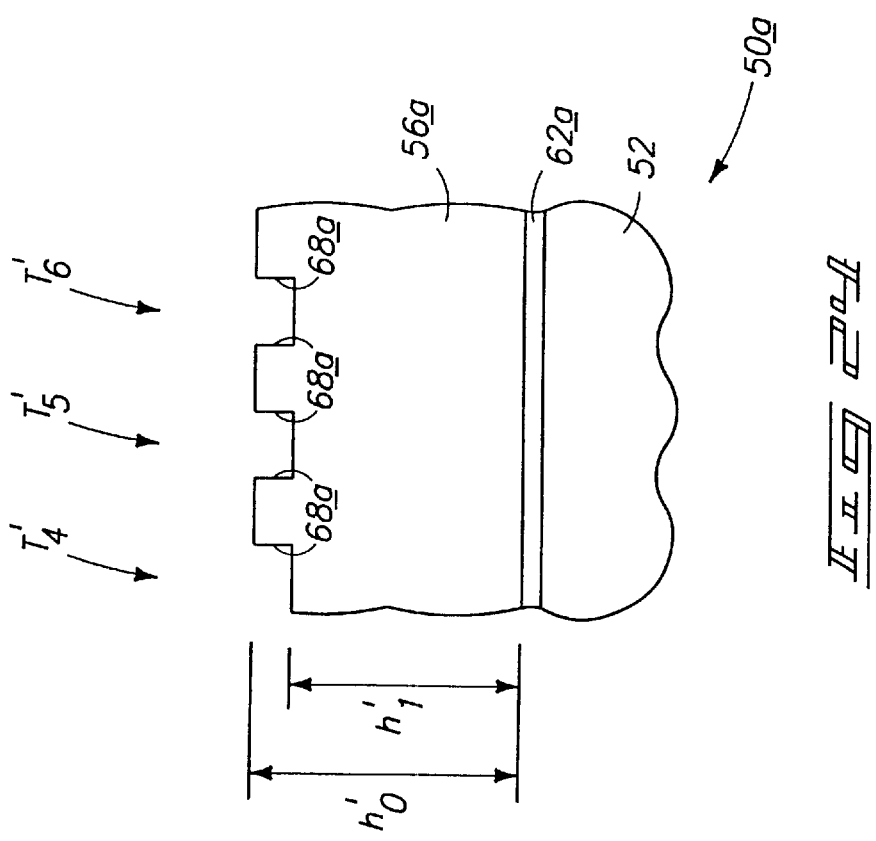

Referring to FIG. 21, a layer of patterned photoresist 64 is formed over substrate 52.

Referring to FIGS. 22–25, a first series of first trenches $T_1'$, $T_2'$, and $T_3'$ are etched or otherwise formed in layer 56a. Subsequently, photoresist 64 is removed and another layer of patterned photoresist 66a (FIG. 23) is formed to define an area within which a second series of second trenches are to be etched. Such trenches are subsequently etched and are illustrated at $T_4'$, $T_5'$, and $T_6'$.

Figure 27:
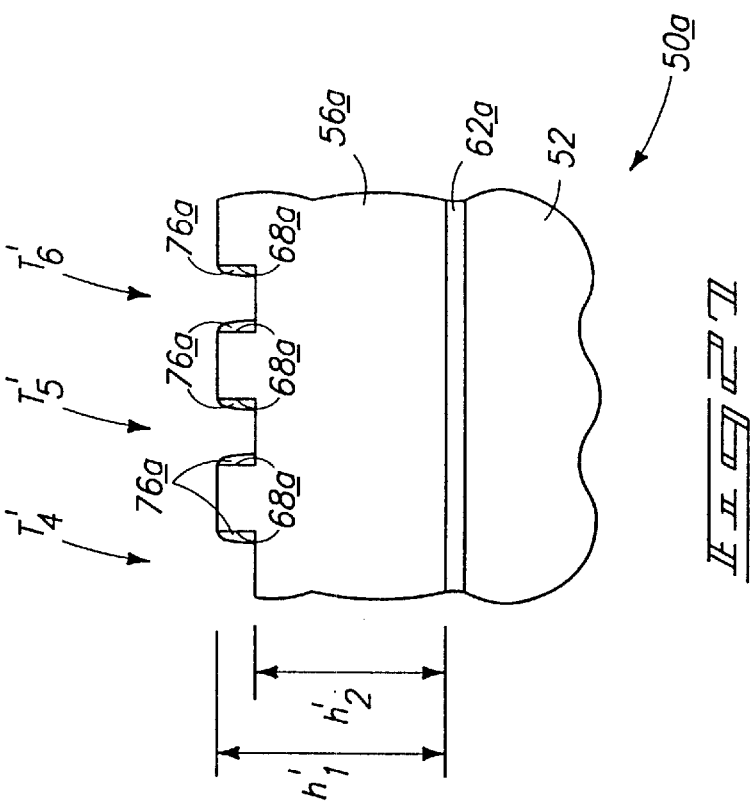
FIGS. 26 and 27 are respective views of the FIGS. 24 and 25 wafer fragment at another processing step.
Figure 26:
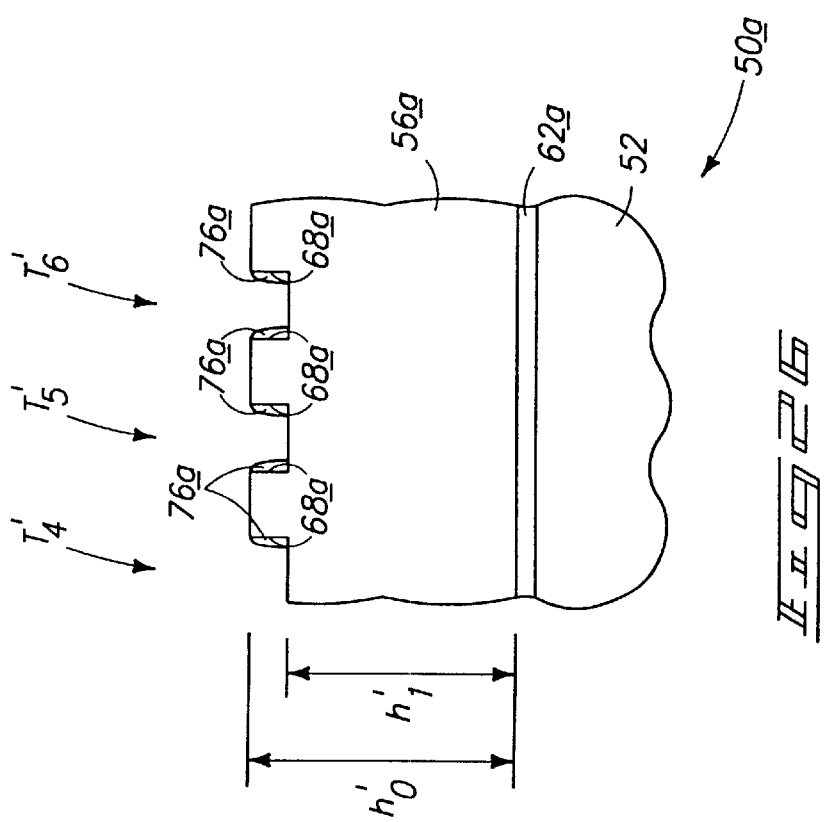
Figure 9H:
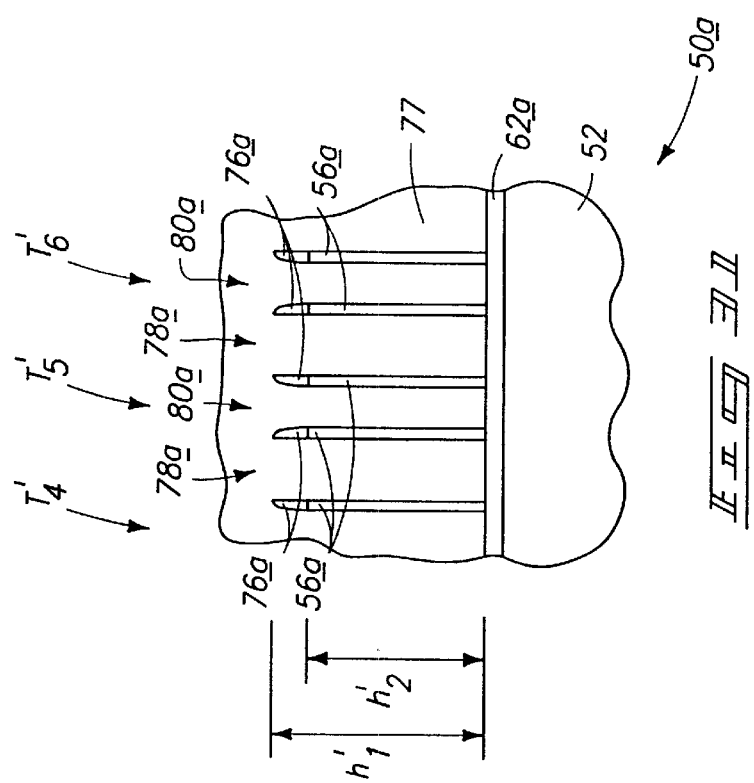
Figure 9G:
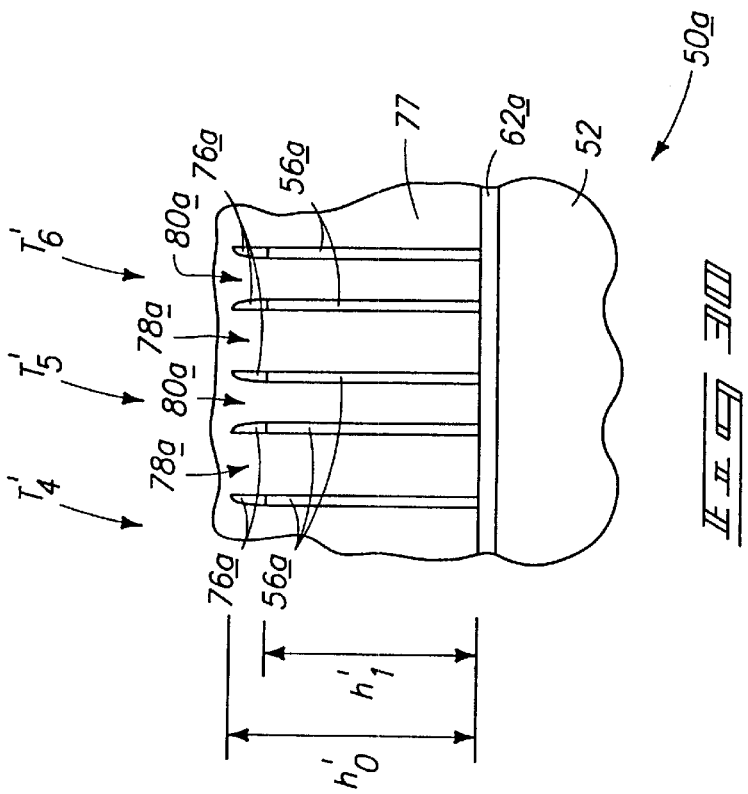
Figure 6H:
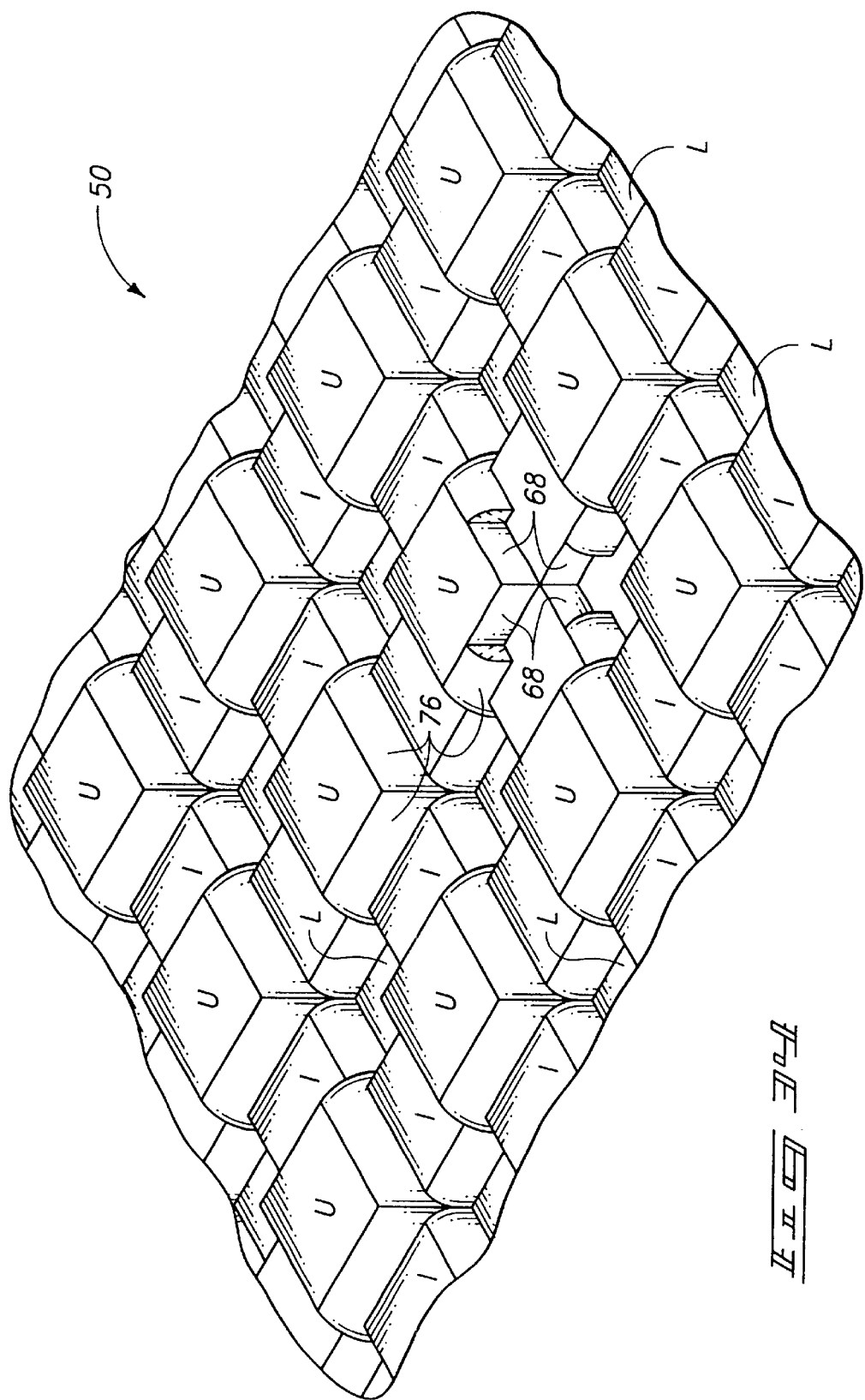

Referring to FIGS. 26 and 27, sidewall spacers 76a are formed over respective sidewalls 68a. The material from which sidewall spacers 76a are formed preferably comprises an etchably different material from the material comprising layer 56a. Accordingly, where layer 56a comprises TEOS or BPSG, the material comprising sidewall spacers 76a can comprise polysilicon or silicon nitride. Other materials include various nitrides and oxynitrides. In one aspect, the material from which sidewall spacers 76a are formed and the material from which layer 62a is formed comprise etchably similar materials. Accordingly, where layer 62a comprises a silicon nitride material, so too does sidewall spacers 76a.

Referring to FIGS. 28 and 29, material of first layer 56a is substantially selectively etched relative to sidewall spacers 76a and layer 62a. Preferably, layer 62a is outwardly exposed by the etch. Such etching constitutes transferring the lateral width dimensions of the spacers into an underlying layer of material to define a plurality of cells 78a, 80a. The illustrated cells are separated from one another by no more than a lateral width dimension of an associated previously-formed sidewall spacer.

Referring to FIGS. 30 and 31, a layer of photoresist 77 is formed over the substrate and within the individual cells. The photoresist can be spun on sufficiently to fill the individual cells. With the photoresist in place, the substrate is subjected to suitable planarizing processing sufficient to remove some and preferably all of the material comprising the sidewall spacers. The photoresist prevents debris from falling into the cells during the planarizing of the substrate. Accordingly, the sidewall spacers can be mechanically abraded as by chemical mechanical polishing to substantially remove them from over the substrate. The resultant cell structures, with the photoresist having been removed, are shown in FIGS. 32, 33 where each cell is essentially the same height.

The above-described methodologies and resultant structures are particularly useful in the context of forming dynamic random access memory (DRAM) devices. Specifically, the above described cells can be utilized as capacitor containers which permit capacitors to be formed having desirable separation distances which are less than minimum photolithographic feature sizes. Specifically, DRAM circuitry typically includes row lines and bit lines which have a dielectric material deposited thereover to electrically isolate and insulate the lines from other components. The above-described assembly of layers (the plural layers and/or the single layer embodiments) can be formed over the row lines and bit lines, with the insulative dielectric material over the row lines and bit lines serving as an etch stop for the above-described cell formation. Processing would take place substantially as described above as far as trench formation and cell etching is concerned. The material selected for the spacers can be chosen to have similar etch characteristics as the insulative dielectric material over the row lines and bit lines. Then, etching of the cells could be tailored to slow or terminate proximate the insulative dielectric material. Alternately, a material such as polysilicon can be selected for the spacers. This would, after cell formation, permit the spacers to be subsequently removed during DRAM storage node isolation. Specifically, storage node isolation typically includes mechanical planarization of a previously-formed polysilicon-comprising storage node layer which is deposited into the individual cells. By virtue of the fact that the spacers and the node material are polysilicon, both can be subjected to planarization which removes the spacers and desirably isolates the storage node layer within individual cells. Other uses will be apparent to the skilled artisan.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming integrated circuitry comprising:
   forming a plurality of layers over a substrate;

forming a series of first trenches into a first of the layers and extending along a first direction generally parallel to a top surface of the substrate;

forming a series of second trenches into the first layer and extending along a second direction generally parallel to the top surface, the first and second trenches defining a plurality of different substrate elevations joined by sidewalls;

forming sidewall spacers over the sidewalls; and selectively removing material of the first layer without removing the spacers.

2. The method of claim 1, further comprising removing the material from which the spacers are formed by selectively etching the material from which the spacers are formed relative to the first material.

3. The method of claim 1, further comprising removing the material from which the spacers are formed by mechanically abrading the material from which the spacers are formed.

4. The method of claim 3, wherein abrading comprises chemical mechanical polishing the material from which the spacers are formed.

5. The method of claim 1, wherein:

forming the plurality of layers comprises interposing an etch stop layer between the first layer and an underlying second layer; and selectively removing material of the first layer comprises terminating selectively removing proximate the etch stop layer.

6. The method of claim 5, wherein selectively removing material of the first layer comprises terminating etching at a polysilicon etch stop layer and forming the plurality of layers includes forming a first layer comprising an oxide material.

7. The method of claim 5, wherein forming the plurality of layers includes forming the first and second layers to comprise a silicon oxide material.

8. The method of claim 5, wherein forming sidewall spacers comprises forming sidewall spacers from material substantially similar to material from which the etch stop layer is formed.

9. The method of claim 5, wherein forming sidewall spacers comprises forming sidewall spacers from material etchably similar to material from which the etch stop layer is formed.

10. The method of claim 9, wherein forming sidewall spacers comprises forming sidewall spacers from polysilicon.

11. The method of claim 5, wherein forming the plurality of layers comprises forming first and second layers comprising etchably similar materials.

12. The method of claim 11, wherein forming the plurality of layers comprises forming first and second layers comprising silicon oxide materials.

13. The method of claim 1, wherein forming the plurality of layers comprises interposing a second layer between the first layer and the substrate, the first and second layers comprising etchably similar materials.

14. The method of claim 1, wherein forming the plurality of layers comprises interposing a second layer between the first layer and the substrate, the first and second layers comprising etchably different materials.

15. The method of claim 1, wherein forming the plurality of layers comprises interposing a second layer comprising silicon nitride between the first layer and the substrate, the first layer comprising an oxide, the second layer comprising silicon nitride.

16. The method of claim 1, wherein forming a series of second trenches comprises forming a series of second trenches generally transverse to the series of first trenches.

17. The method of claim 1, further comprising removing the material from which the spacers are formed.

18. A method of forming integrated circuitry comprising:

forming a layer of material over a substrate;

etching a series of first trenches into the layer and extending along a first direction generally parallel to a top surface of the substrate;

etching a series of second trenches into the layer and in a second direction which is different from the first direction, the second direction being generally parallel to the top surface, the first and second trenches defining a plurality of different substrate elevations, adjacent elevations being joined by sidewalls which extend therebetween;

forming sidewall spacers over the sidewalls; and selectively etching material of the layer relative to material from which the spacers are formed, the etching defining a plurality of cells at least some adjacent cells being separated from one another by no more than a width dimension of a respective one of the spacers.

19. The method of claim 18, further comprising removing the spacer material by etching.

20. The method of claim 18, further comprising removing the spacer material by chemical mechanical polishing.

21. The method of claim 18, further comprising, removing material comprising the spacer material, and prior to removing, forming photoresist at least within the plurality of cells, removing comprising chemical mechanical polishing the spacer material.

22. The method of claim 18, wherein forming a series of second trenches comprises forming a series of second trenches generally transverse to the series of first trenches.

23. The method of claim 18, wherein forming the layer comprises forming an oxide layer.

24. The method of claim 18, wherein:

forming the layer comprises forming an oxide layer; and forming sidewall spacers comprises forming nitride sidewall spacers.

25. The method of claim 18, wherein:

forming the layer comprises forming an oxide layer; and forming sidewall spacers comprises forming polysilicon sidewall spacers.

26. The method of claim 18, further comprising removing material comprising the spacer material.

27. A method of forming integrated circuitry comprising:

forming at least first and second layers over a substrate;

forming sidewalls in the first layer and at different relative elevations;

forming sidewall spacers over the sidewalls; and first etching material of the layers substantially selective relative to the spacers.

28. The method of claim 27, wherein forming at least first and second layers comprises forming the first layer to comprise an oxide.

29. The method of claim 27, wherein forming the sidewall spacers comprises forming spacers from a material etchably different from the first layer.

30. The method of claim 27, further comprising second etching the second layer.

31. The method of claim 30, wherein forming the second layer comprises forming an oxide layer.

32. The method of claim 27, wherein forming the sidewalls comprises etching an array of trenches within the first layer.

33. The method of claim 32, wherein etching the array comprises:

patterning and etching a first series of trenches; and patterning and etching a second series of trenches.

34. The method of claim 33, wherein patterning and etching the first and second series of trenches includes defining respective first and second trench directions which are different from one another.

35. The method of claim 33, wherein patterning and etching the first and second series of trenches includes defining generally transverse first and second trench directions.

36. The method of claim 33, wherein patterning and etching the first and second series of trenches includes defining first, second, and third elevations over the substrate which are different from one another.

37. The method of claim 33, wherein patterning and etching the first and second series of trenches includes defining:

first and second trench directions that are generally transverse one another;

first, second, and third elevations over the substrate which are different from one another; and individual trenches of the array having no more than two elevations therewithin.

38. The method of claim 33, wherein patterning and etching the first and second series of trenches includes defining individual trenches having a plurality of elevations over the substrate.

39. The method of claim 33, wherein patterning and etching the first and second series of trenches includes defining individual trenches comprising no more than two elevations therewithin.

40. The method of claim 27, further comprising second etching different material of the layers substantially selective relative to the material of the layers first etched.

41. A method of forming integrated circuitry comprising:

transferring a substrate structure profile into an underlying layer of material formed over a semiconductive substrate, the substrate structure comprising an array of sidewall spacers; and transferring the substrate structure profile into at least one different other underlying layer sufficient to form a plurality of cells, at least some adjacent cells being separated from one another by no more than a width dimension of the sidewall spacers, the width dimension being less than a sidewall height dimension, the substrate structure profile comprising the width dimension.

42. The method of claim 41, further comprising, prior to transferring of the substrate structure profile, forming a plurality of substrate structures having respective substrate structure profiles, at least some of the substrate structures being formed at different elevations relative to the substrate.

43. The method of claim 41, wherein transferring the profile into the underlying layer and the at least one different other underlying layer comprises selectively etching at least one of the layers relative to material from which the substrate structure profile is formed.

44. The method of claim 43, wherein selectively etching comprises selectively etching at least two of the layers relative to material from which the substrate structure profile is formed.

45. The method of claim 41, further comprising, prior to transferring of the substrate structure profile, forming at least three layers of material over the substrate, the profile being transferred into three of the layers.

46. The method of claim 45, wherein transferring the profile into the underlying layer and the at least one different other underlying layer comprises selectively etching at least one of the layers relative to material from which the substrate structure profile is formed.

47. The method of claim 41, wherein transferring the substrate structure profile into at least one different other underlying layer comprises using the sidewall spacers as an etch mask.

48. A method of forming integrated circuitry comprising:

forming an array of sidewall spacers over a plurality of layers of material, the spacers having respective lateral width dimensions; and defining a plurality of cells by etching the plurality of layers, at least some adjacent cells being separated from one another by no more than an individual spacer lateral width dimension.

49. The method of claim 48, wherein forming the array of sidewall spacers comprises forming spacers at different elevations in the plurality of layers.

50. The method of claim 49, wherein forming the array of sidewall spacers comprises:

etching a series of first trenches into a top one of the plurality of layers, the first trenches being etched in a first direction; and etching a series of second trenches into the top layer and in a second direction which is different from the first direction, the first and second trenches defining a plurality of different elevations, adjacent elevations being joined by sidewalls which extend therebetween, individual sidewall spacers of the array of sidewall spacers being formed over individual respective sidewalls.

51. The method of claim 50, further comprising, after defining a plurality of cells, planarizing the plurality of layers sufficient to remove at least some of the sidewall spacers.

52. The method of claim 50, further comprising, after defining a plurality of cells, forming photoresist within the plurality of cells and planarizing the plurality of layers sufficient to remove the sidewall spacers.

53. The method of claim 48, wherein forming the array of sidewall spacers comprises forming spacers comprising polysilicon.

54. The method of claim 48, wherein forming the array of sidewall spacers comprises forming spacers within a layer of material which is etchably different than material from which the spacers are formed.

55. The method of claim 54, wherein defining a plurality of cells comprises selectively etching the layer within which the spacers are formed relative to material from which the spacers are formed.

56. The method of claim 55, wherein forming the array of sidewall spacers comprises forming spacers comprising polysilicon.

57. The method of claim 55, further comprising selectively etching a layer underlying the layer within which the spacers are formed relative to material comprising the layer within which the spacers are formed.

58. The method of claim 57, wherein forming the array of sidewall spacers comprises forming spacers from the same material as the layer underlying the layer within which the spacers are formed.

59. The method of claim 57, further comprising, after etching the underlying layer, etching a next adjacent underlying layer.

60. The method of claim 59, wherein etching the next adjacent underlying layer comprises selectively etching the next adjacent underlying layer relative to the underlying layer.

61. The method of claim 48, wherein defining a plurality of cells comprises etching at least some of the plurality of layers sufficiently to transfer the lateral width dimensions of the array of spacers into the plurality of layers.

62. A method of forming integrated circuitry comprising:

providing a substrate;

forming an assembly of layers over the substrate; and defining a matrix comprising a plurality of elevational planes disposed within the assembly, the plurality of planes defining three different elevations comprising a lowermost elevation, an intermediate elevation, and an uppermost elevation relative to the substrate;

at least some of the lowermost elevations being disposed proximate four intermediate elevations and being joined therewith by sidewalls which extend therebetween;

at least some of the intermediate elevations being disposed proximate two lowermost elevations and two uppermost elevations and being joined therewith by sidewalls which extend therebetween; and at least some of the uppermost elevations being disposed proximate four intermediate elevations and being joined therewith by sidewalls which extend therebetween.

63. The method of claim 62, further comprising:

forming sidewall spacers over the sidewalls, the spacers having individual lateral width dimensions; and removing material from at least one layer of the assembly, the material being disposed elevationally below at least some of the spacers, at least some of the material being selectively removed relative to material from which the spacers are formed.

64. The method of claim 63, wherein removing comprises removing material from at least two layers of the assembly.

65. The method of claim 63, wherein removing comprises defining a plurality of cells, at least some adjacent cells being separated from one another by no more than an individual spacer lateral width dimension.

* * * * *

UNITED STATES PATENT AND TRADEMARK OFFICE
CERTIFICATE OF CORRECTION

PATENT NO.    : 6,352,932 B1
DATED         : March 5, 2002
INVENTOR(S)   : Darwin A. Clampitt et al.

It is certified that error appears in the above-identified patent and that said Letters Patent is hereby corrected as shown below:

Column 3,
Line 46, replace "elevational heights ho have not" with -- elevational heights $h_o$ have not --
Line 51, replace "abovedescribed first and second" with -- above-described first and second --

Column 4,
Line 27, replace "substrate is structure profiles," with -- substrate structure profiles --

Signed and Sealed this

Twenty-third Day of July, 2002

Attest:

Attesting Officer

JAMES E. ROGAN
Director of the United States Patent and Trademark Office